United States Patent [19]

Narabu et al.

[11] Patent Number: 4,939,560
[45] Date of Patent: Jul. 3, 1990

[54] CHARGE TRANSFER DEVICE

[75] Inventors: Tadakuni Narabu; Yasuhito Maki; Tetsuya Kondo, all of Kanagawa, Japan

[73] Assignee: Sony Corporation, Tokyo, Japan

[21] Appl. No.: 331,000

[22] Filed: Mar. 29, 1989

Related U.S. Application Data

[63] Continuation of Ser. No. 116,256, Nov. 3, 1987, abandoned.

[30] Foreign Application Priority Data

Nov. 10, 1986 [JP] Japan ................................ 61-267264

[51] Int. Cl.$^5$ ..................... H01L 29/78; H01L 27/02; H01L 27/04
[52] U.S. Cl. .......................................... 357/24; 357/47; 357/48; 377/57; 377/58; 377/60; 377/62; 377/63
[58] Field of Search ................. 357/24, 24 LR, 24 M, 357/47, 48; 377/57, 58, 60, 62, 63

[56] References Cited

U.S. PATENT DOCUMENTS

| | | |
|---|---|---|
| 4,171,521 | 10/1979 | Wang et al. ............................ 357/24 |
| 4,179,793 | 12/1979 | Hagiwara ................................ 357/24 |
| 4,538,287 | 8/1985 | Roberts et al. . | |
| 4,691,218 | 9/1987 | Bohdewijns ....................... 357/24 M |

FOREIGN PATENT DOCUMENTS

| | | |
|---|---|---|
| 0233526 | 8/1987 | European Pat. Off. . |
| A-2390010 | 12/1978 | France . |
| 61-210670 | 9/1986 | Japan ...................................... 357/24 |

Primary Examiner—Andrew J. James
Assistant Examiner—Ngan Van Ngo
Attorney, Agent, or Firm—Hill, Van Santen, Steadman & Simpson

[57] ABSTRACT

A charge transfer device, suitable for use, for example, in a solid state imager device, having a floating gate electrode in a charge detecting section, a protruding portion provided in at least one of the floating gate electrodes or a gate electrode arranged adjacent to the floating gate electrode, wherein the floating gate electrode and the gate electrode arranged adjacent to the floating gate electrode overlap each other at the protruding portion within an insulating layer, and whereby the parasitic capacitance associated with the floating gate electrode is decreased and the charge voltage converting gain is increased, rendering it possible to obtain an image signal with a good signal/noise ratio, when the charge transfer device is used for a solid state imager device.

7 Claims, 5 Drawing Sheets

CHARGE TRANSFER DEVICE

This is a continuation of application Ser. No. 116,256, filed Nov. 3, 1987, now abandoned.

BACKGROUND OF THE INVENTION

1. Field of the Invention

This invention relates generally to charge transfer devices and specifically to a charge coupled device suitable for use, for example, in a solid state imager device.

2. Description of the Prior Art

A conventional charge transfer device is a charge coupled device (CCD). Such a device is shown in FIGS. 1 and 2 which illustrate a main portion thereof.

In these drawings, reference numeral 1 designates a P-type silicon substrate which is provided with an input section (not shown), a charge transfer section 2 for transferring signal charges delivered by the input section and a charge detecting section 3 for detecting the signal charges transferred through the charge transfer section 2. Although the input section is not shown in the drawings, it is assumed to be constructed in a known manner such that the signal charges can be delivered to the charge transfer section 2.

The charge transfer section 2 is arranged so as to transfer the signal charges by the use of symmetrical two-phase clock pulses $\phi_1$ and $\phi_2$. More specifically, as a part of the CCD shown in FIGS. 1 and 2, there are formed on the P-type silicon substrate 1 a transfer gate region 4T formed of an N$^-$-type region, a storage gate region 4S formed of an N-type region, a transfer gate region 5T formed of an N$^-$-type region and a storage gate region 5S formed of an N-type region which serves as a transfer path for the signal charges. These transfer gate regions are formed sequentially in this order. Furthermore, above the transfer gate region 4T, the storage gate region 4S, the transfer gate region 5T and the storage gate region 5S there are provided, within an insulating layer 6, a transfer gate electrode 7T, a storage gate electrode 7S, a transfer gate electrode 8T and a storage gate electrode 8S, all of which are made of polysilicon and serve as transfer electrodes. The transfer gate electrode 7T and the storage gate electrode 7S are coupled together to a clock pulse input terminal g which is supplied with the clock pulse $\phi_1$. The transfer gate electrode 8T and the storage gate electrode 8S are coupled together to a clock pulse input terminal 10 which is supplied with the other clock pulse $\phi_2$.

The charge detecting section 3 is constructed in a manner such that the signal charges transferred by way of the charge transfer section 2 can be detected undestructively. In the device of FIGS. 1 and 2, a floating gate region 11 of an N-type region is coupled through an output gate region 12 of an N-type region to the storage gate region 5S, which is the terminal portion of the transfer path of the charge transfer section 2. Furthermore, a floating gate electrode 13 and an output gate electrode 14, both made of polysilicon, are provided above the floating gate region 11 and the output gate region 12, respectively, within the insulating layer 6. The output gate electrode 14 is connected to a direct current DC input terminal 15 which is supplied with a predetermined DC voltage $V_{OG1}$. The floating gate electrode 13 is connected to an output terminal 17 through an amplifier 16 formed of an MOS-type field effect transistor (MOSFET) formed on the same substrate 1. The floating gate electrode 13 is also connected, through a source drain path of the MOSFET 18 which is triggered by a reset pulse $\phi_{RS}$ at its gate electrode, to a DC voltage input terminal 19 which is supplied with a predetermined DC voltage $V_{RS}$ for reset purposes as is known in the art.

A precharge drain N$^+$-type region 20 is formed on the substrate 1 and is coupled to the floating gate region 11 through precharge gate regions 21 and 22 which are formed of N$^-$-type and N-type regions, respectively. On the precharge drain region 20 there is provided through openings 6A, 6B, 6C and 6D of the insulating layer 6, a precharge drain electrode 23 made of aluminum which is connected to the precharge drain region 20. Above the precharge gate regions 21 and 22, precharge gate electrodes 24 and 25 made of polysilicon are provided within the insulating layer 6 as shown in FIG. 2. The precharge drain electrode 23 is connected to a DC voltage input terminal 26 which is supplied with a predetermined DC voltage $V_{PD}$. The precharge gate electrodes 24 and 25 are both connected to a clock pulse input terminal 27 which is supplied with a predetermined clock pulse $\phi_{PG}$ which is synchronized with the clock pulses $\phi_1$ and $\phi_2$.

Additionally, in FIG. 1, reference numeral 28 designates an element isolating region made of selective oxide layer, and reference numerals 29 and 30, designate channel stopper regions indicated by hatchings of broken lines formed of P$^+$-type regions.

In the prior art CCD of the present example, the signal charges delivered from the input section are transferred through the transfer paths 4T, 4S, 5T, 5S, . . . . 4T, 4S, 5T, 5S to the floating gate region 11 through the output gate region 12. Thereafter, the signal charges are discharged to the precharge drain region 20 through the precharge gate regions 21 and 22.

When the signal charges are transferred to the floating gate region 11, the electro-static capacity between the floating gate electrode 13 and the substrate 1 is changed. Therefore, the floating gate electrode 13 is always charged with the voltage $V_{RS}$ through the MOSFET 18 before the signal charges are delivered to the floating gate region 11 so that the voltage change produced in the floating gate electrode 13 corresponds to the amount of the transferred signal charges to the floating gate region 11. Thus, the CCD of the present example can provide at the output terminal 17 an amplified signal representative of the change in voltage produced in the floating gate electrode 13 corresponding to the amount of the transferred signal charges as an output signal.

As shown further in FIGS. 1 and 2, the rear end portion of the output gate electrode 14 and the front end portion of the floating gate electrode 13 overlap each other within the insulating layer 6, and the rear end portion of the floating gate electrode 13 and the front end portion of the precharge gate electrode 24 overlap each other within the insulating layer 6, so as to prevent potential barriers between the output gate region 12 and the floating gate region 11 and between the floating gate region 11 and the precharge gate region 21, respectively, so that the signal charges can be transferred smoothly.

However, in the above described CCD, the area of overlap of portion 31 of the floating gate electrode 13 and the output gate electrode 14, the area of overlap of portion 32 of the floating gate electrode 13 and the precharge gate electrode 24 and the area of overlap of portions 33 and 34 of the floating gate electrode 13 and the channel stopper regions 29 and 30 are relatively wide. Therefore, the parasitic capacitance of the floating gate electrode 13 becomes large enough so that the charge detecting sensitivity at the floating gate electrode 13 is decreased. In other words, the charge voltage converting gain at the floating gate electrode 13 is decreased and accordingly an output signal with a good signal/noise ratio cannot be provided at the output terminal 17.

With the recent tendency in the art of aiming for a highly dense and integrated solid state imager device, the light receiving area has been decreasing so that the amount of the signal charges treated in one pixcel has become less and less. Therefore, there has been strongly desired, a CCD for use in such solid state imager devices to provide an output signal with a good signal/noise ratio despite the decrease in light receiving areas.

SUMMARY OF THE INVENTION

The present invention provides a charge transfer device for use in a solid state imager device which is capable of producing output signals with a good signal/noise ratio despite a decreased light receiving area. The present invention provides a charge transfer device having a floating gate electrode in a charge detecting section comprising a protruding portion provided in at least one of the floating gate electrode or a gate electrode arranged adjacent to the floating gate electrode, wherein the floating gate electrode and the gate electrode arranged adjacent to the floating gate electrode overlap each other at the protruding portion within an insulating layer.

Therefore, an object of the present invention is to provide a charge transfer device wherein a protruding portion of a floating gate electrode or of an adjacently placed gate electrode overlaps the other so as to reduce parasitic capacitance associated with the floating gate electrode, thereby permitting a good signal/noise ratio at an output terminal of a solid state imager device. These and other objects, features and advantages of the present invention will become apparent from the following detailed description of the preferred embodiment taken in conjunction with the accompanying drawings, throughout which like reference numerals designate like elements and parts.

DESCRIPTION OF THE PREFERRED EMBODIMENT

Figure 1:
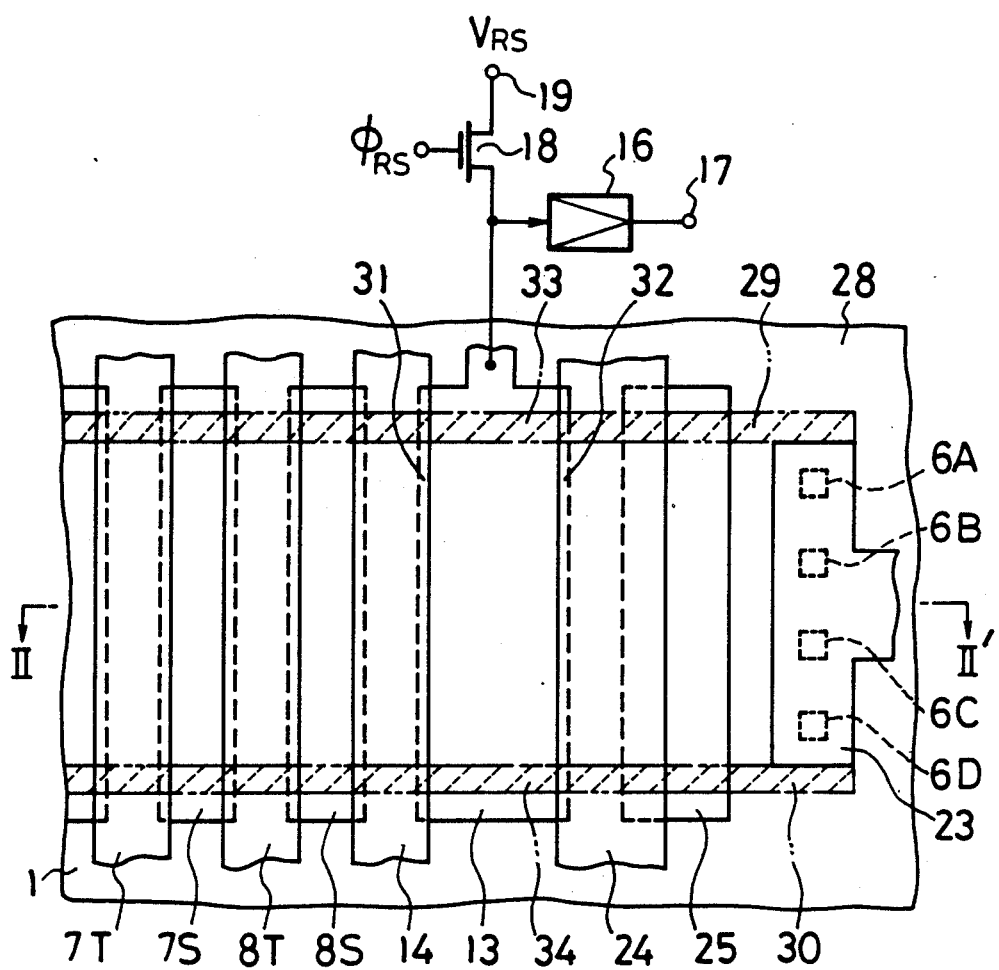
FIG. 1 is a top plan view showing a main portion of a prior art charge transfer device.
Figure 2:
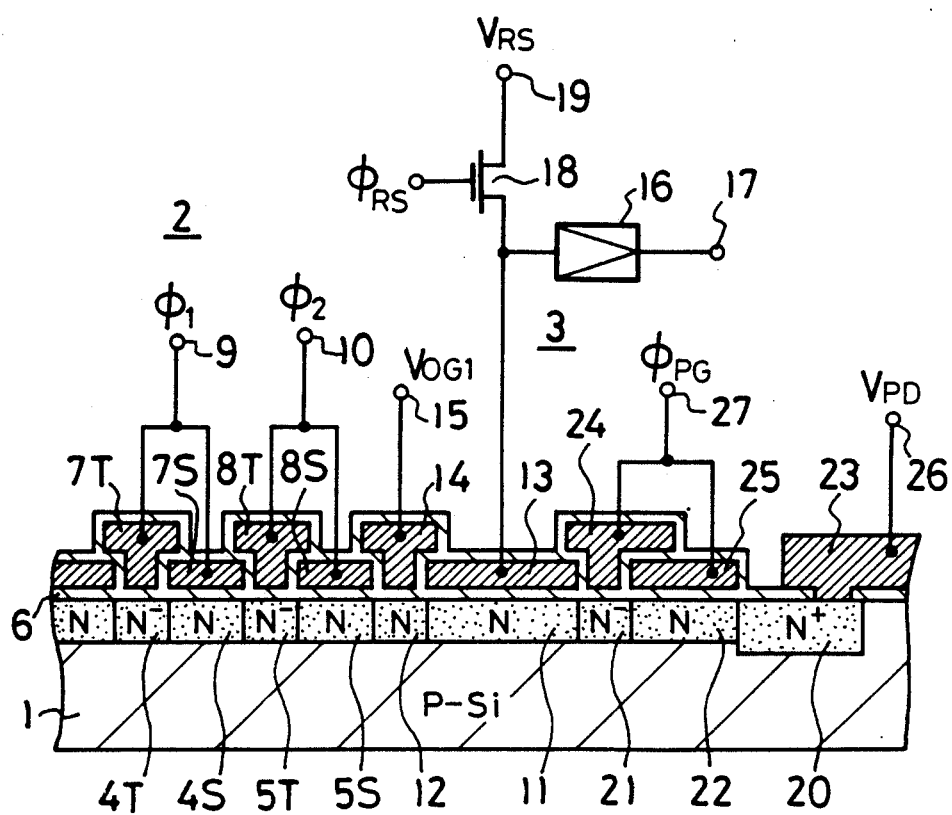
FIG. 2 is a cross-sectional view of the charge transfer device shown in FIG. 1 taken along a line II—II.
Figure 4:
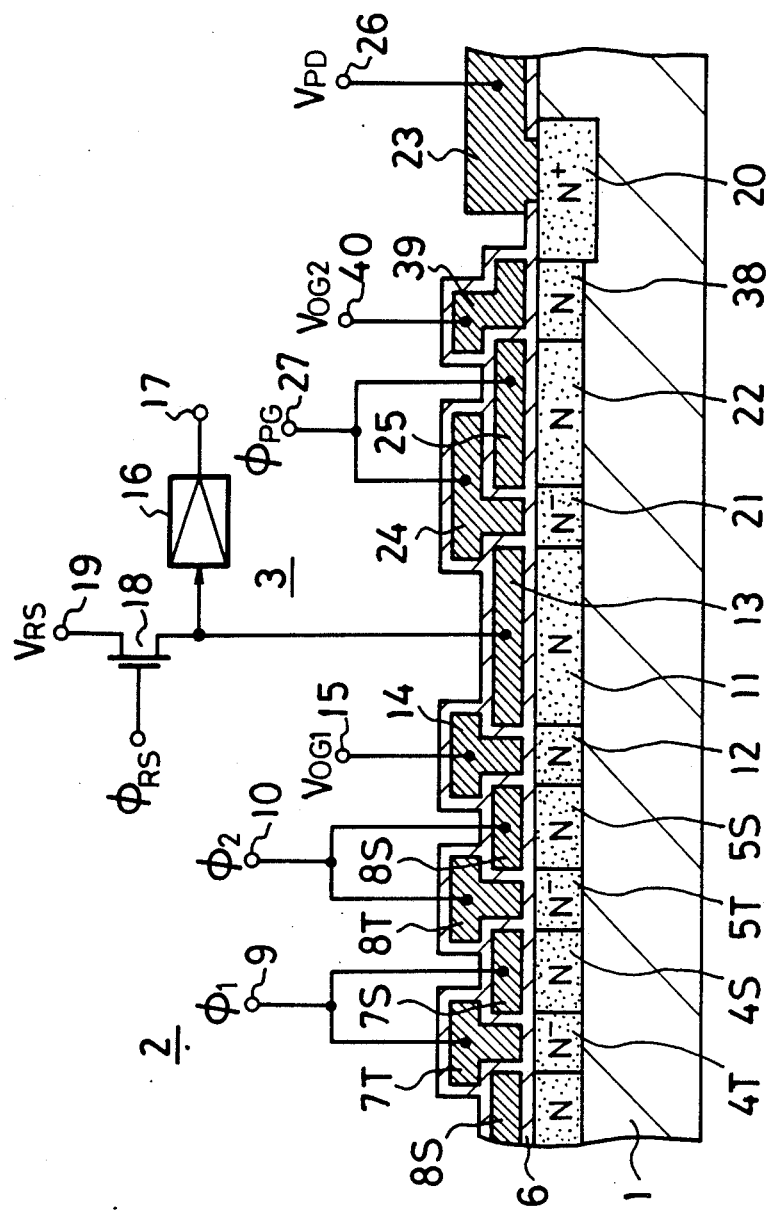
FIG. 4 is a cross-sectional view of the charge transfer device shown in FIG. 3 taken along a line IV—IV.
Figure 5:
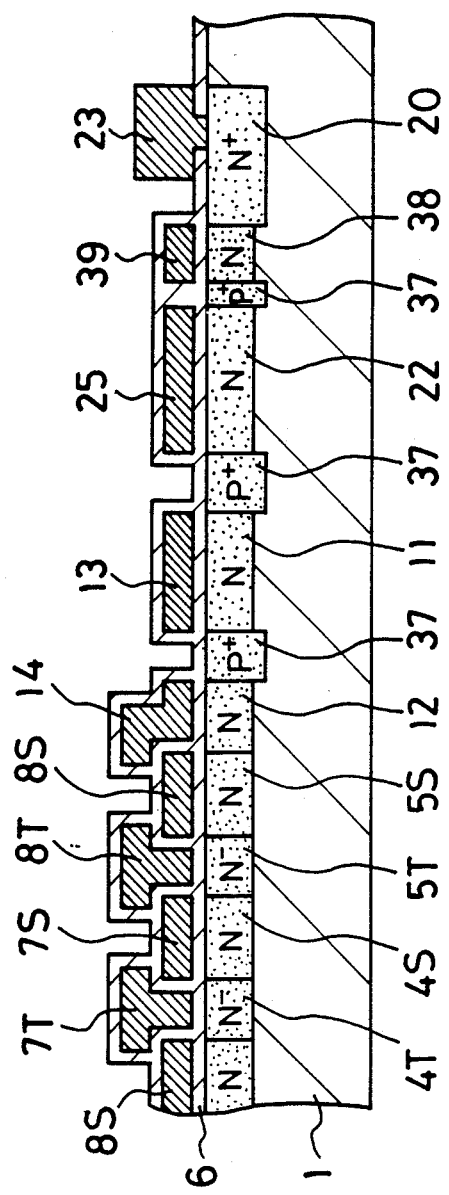
FIG. 5 is a cross-sectional view of the charge transfer device shown in FIG. 3 taken along a line V—V.

An embodiment of a charge transfer device according to the present invention will hereinafter be described with reference to FIGS. 3–5, wherein the present invention is applied to a burried channel CCD (BCCD). The elements in FIGS. 3–5 corresponding to those of the prior art device in FIGS. 1 and 2 are designated by the same reference numerals and, to avoid needless repetition, the explanation thereof will be omitted.

Figure 3:
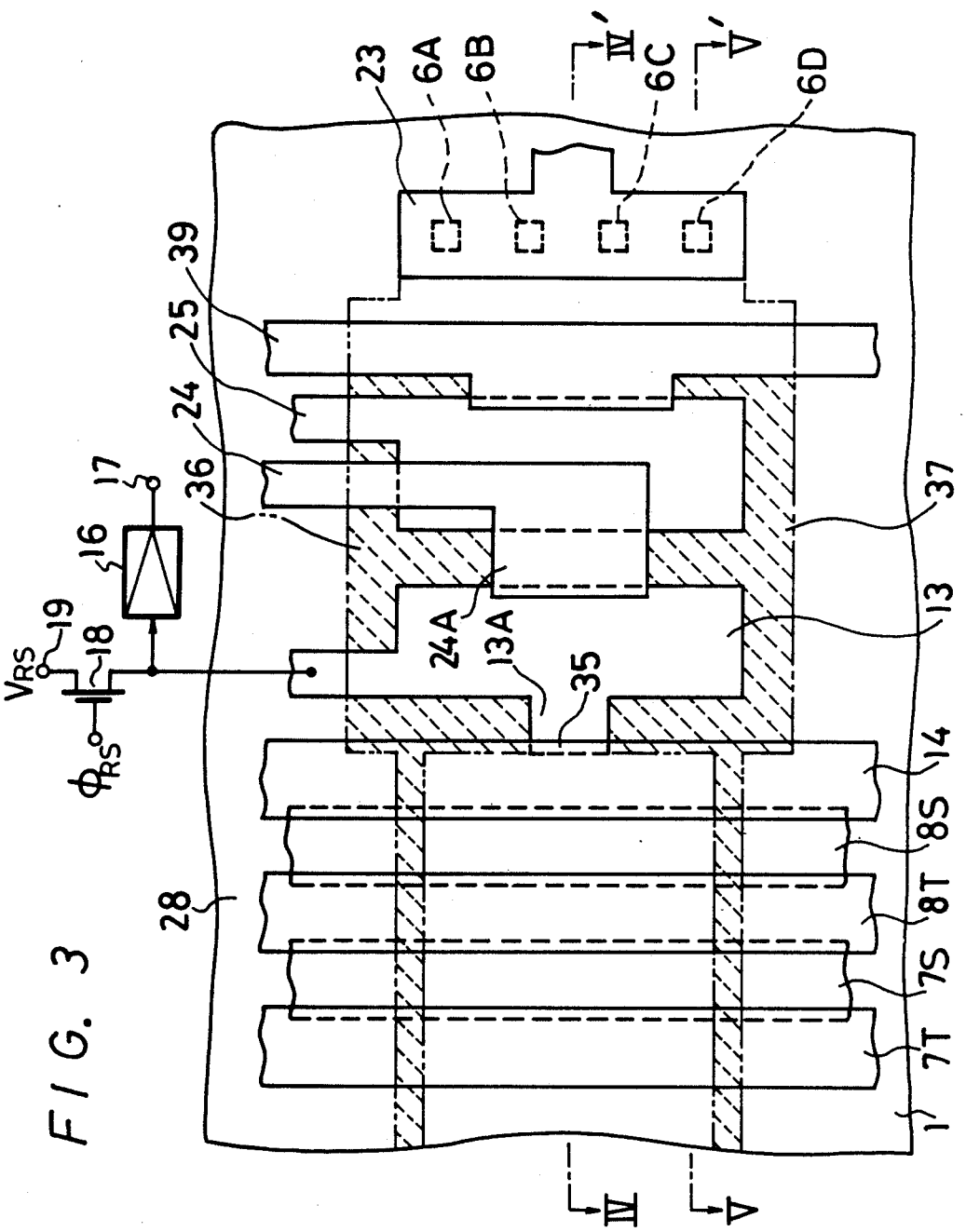
FIG. 3 is a top plan view showing a main portion of an embodiment of a charge transfer device according to the principles of the present invention.

As shown in FIG. 3, a protrusion 13A is provided at the substantially central portion of the front end portion of a floating gate electrode 13 in such a manner that the front end portion of the protrusion 13A of the floating gate electrode 13 overlaps an output gate electrode 14 and the signal charges transferred by way of a charge transfer from section 2 to its output gate region 12 arranged beneath the overlapped portion can be delivered to a floating gate region 11. A protrusion 24A having a width narrower than that of the floating gate electrode 13 is provided at the front end portion of a precharged gate electrode 24 in such a manner that the front portion of the protrusion 24A of the precharged gate electrode 24 overlaps the floating gate electrode 13 within the insulating layer 6 and the signal charges can be transferred to the precharge gate region 21 by way of the floating gate region 11 arranged beneath the overlapped portion.

Channel stopper regions 36 and 37 of a P+-type region are formed in an area indicated by hatchings of broken lines in FIG. 3 such that the floating gate electrode 13 does not at all overlap with the channel stopper regions 36 and 37.

An output gate region 38 formed of an N-type region is provided on the substrate 1 between the precharge gate region 22 and the precharge drain region 20. On the output gate region 38 there is provided within the insulating layer 6 an output gate electrode 39 which is supplied with a predetermined DC voltage $V_{OG2}$ through a terminal 40, so that the signal charges flowing into the floating gate region 11 can be discharged to the precharge drain region 20 through the precharge gate regions 21 and 22 and the output gate region 38.

The rest of the charge transfer device of the present invention is constructed in the same manner as the prior art example shown in FIGS. 1 and 2.

In the BCCD of the preferred embodiment constructed as described above, the signal charges delivered from the input section (not shown) are transferred by way of the transfer paths 4T, 4S, 5T, 5S, . . . . 4T, 4S, 5T, 5S of the charge transfer section 2 to the floating gate region 11 through the output gate region 12. Then, the signal charges are discharged to the precharge drain region 20 through the precharge gate regions 21 and 22 and the output gate region 38.

When the signal charges are transferred to the floating gate region 11, the electro-static capacitance between the floating gate electrode 13 and the substrate 1 is changed. In this embodiment, the floating gate electrode 13 is always charged with the voltage $V_{RS}$ through the MOSFET 18 before the signal charges are delivered to the floating gate region 11 so that the change in voltage produced in the floating gate electrode 13 corresponds to the amount of the transferred signal charges delivered to the floating gate region 11. Therefore, the BCCD of the present embodiment can also provide at the output terminal 17 an amplified signal representative of the change in voltage produced in the floating gate electrode 13 corresponding to the amount of the transferred signal charges.

Since the front end portion of the protrusion 13A of the floating gate electrode 13 overlaps the output gate electrode 14 within the insulating layer 6, the parasitic capacitance produced between the floating gate electrode 13 and the output gate electrode 14 can be largely decreased. Additionally, since the front end portion of the protrusion 24A of the precharge gate electrode 24 overlaps with the floating gate electrode 13 within the insulating layer 6, the parasitic capacitance produced between the floating gate electrode 13 and the precharge gate electrode 24 can be also largely decreased. Furthermore, the floating gate electrode 13 and the channel stopper regions 36 and 37 are arranged such that they do not overlap with one another, so that the parasitic capacitance produced between the floating gate electrode 13 and the channel stopper regions 36 and 37 becomes small enough to be ignored.

As described above, the parasitic capacitance produced in association with the floating gate electrode 13 can be largely decreased so that the charge voltage converting gain in the floating gate electrode 13 is increased and accordingly an output signal with a good signal/noise ratio can be produced. Accordingly, when a BCCD according to the present invention is used for a solid state imager device which has light receiving areas reduced because of high density and high integration of the device to the extent that the amount of treated signal charges in one pixel is decreased, it is possible to produce an image signal with a good signal/noise ratio despite the decreased signal charges.

Although the embodiment above concerns a situation in which the present invention is implemented in a BCCD, the present invention can also be implemented in a surface channel CCD with the same effects and results. Moreover, although the above description is given with respect to a single preferred embodiment of the invention it will be apparent that many modifications and variations may be effected by one skilled in the art without departing from the spirit or scope of the concepts of the invention so that the scope of the invention should be determined by the appended claims only.

We claim:

1. A charge transfer device, comprising:
   a charge detecting section including a floating gate electrode and channel stopper regions formed substantially about ends of said floating gate electrode that extend perpendicularly to a charge transfer direction so that said ends are substantially confined between said channel stopper regions; and
   a charge transfer section including an output gate electrode formed adjacent said floating gate electrode; and
   said floating gate electrode having a protruding portion that overlaps said output gate electrode, said protruding portion having a width less than a width of said overlapped output gate electrode, said widths being measured perpendicularly to the charge transfer direction at a point of overlap, said protruding portion being confined between said channel stopper regions.

2. A charge transfer device as set forth in claim 1, further comprising:
   a second gate electrode formed adjacent said floating gate electrode in said charge detecting section so that said floating gate electrode is positioned between said output gate electrode and said second gate electrode; and
   wherein each of said second gate electrode and said floating gate electrode has a protruding portion said protruding portion of said second gate electrode overlapping said floating gate electrode and said protruding portion of said floating gate electrode overlapping said output gate electrode in said charge transfer section, widths of said protruding portions being less than widths of the respective overlapped gate electrodes as measured at the point of overlap in a direction perpendicular to the direction of the charge transfer, said protruding portion of said second gate electrode being confined between said channel stopper regions.

3. A charge transfer device as set forth in claim 2, wherein the width of said protruding portion of said second gate electrode is greater than the protruding portion of said floating gate electrode.

4. A charge transfer device, comprising:
   a charge transfer section including an output gate electrode; and
   a charge detecting section including a floating gate electrode arranged adjacent said output gate electrode and having a protruding portion that overlaps said output gate electrode, a gate electrode arranged adjacent to said floating gate electrode having a protruding portion that overlaps said floating gate electrode on a side opposite said output gate electrode, and channel stopper regions formed in said device substantially about ends of said gate electrodes that extend perpendicularly from said charge transfer direction so that floating gate electrodes and gate electrode arranged adjacent thereto are substantially confined between said stopper regions, said protruding portions extending in the direction of charge transfer,
   said protruding portions having widths less than widths of their respective overlapped electrodes as measured at the point of overlap and perpendicularly to the charge transfer direction,
   said protruding portions being confined between said channel stopper regions,
   said gate electrodes located within an insulating layer.

5. A charge transfer device as claimed in claim 4, wherein said protruding portion of said floating gate electrode is formed at a substantially central portion of a front edge of said floating gate electrode, said front edge facing said gate electrode in said charge transfer section arranged adjacent to said floating gate electrode.

6. A charge transfer device as claimed in claim 4, wherein said width of said protruding portion of said floating gate electrode is narrower than said width of said output gate electrode in said charge detecting section formed adjacent thereto.

7. A charge transfer device as claimed in claim 4, wherein said gate electrode arranged adjacent said floating gate electrode on a side opposite said output gate electrode is a pre-charged gate electrode.

* * * * *